(12) United States Patent
Yuasa

(10) Patent No.: US 7,956,686 B2
(45) Date of Patent: Jun. 7, 2011

(54) DIFFERENTIAL AMPLIFIER WITH SYMMETRIC CIRCUIT TOPOLOGY

(75) Inventor: Tachio Yuasa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/314,979

(22) Filed: Dec. 19, 2008

(65) Prior Publication Data

US 2010/0007417 A1 Jan. 14, 2010

(30) Foreign Application Priority Data

Dec. 20, 2007 (JP) ................................. 2007-329146
Nov. 6, 2008 (JP) ................................. 2008-285481

(51) Int. Cl.
H03F 3/45 (2006.01)
(52) U.S. Cl. ...................................... 330/253; 330/264
(58) Field of Classification Search .................. 330/253, 330/255, 263, 264
See application file for complete search history.

(56) References Cited

U.S. PATENT DOCUMENTS

| 4,377,789 A | * | 3/1983 | Hoover | 330/253 |
| 5,751,186 A | * | 5/1998 | Nakao | 330/253 |
| 7,474,153 B1 | * | 1/2009 | Dasgupta | 330/255 |

* cited by examiner

*Primary Examiner* — Khanh V Nguyen
(74) *Attorney, Agent, or Firm* — McGinn IP Law Group, PLLC

(57) ABSTRACT

A differential amplifier circuit is provided with a first input stage including a transistor pair of a first conductivity type, of which transistor pair receives differential input signals; a first output stage connected to the first input stage; a second input stage including a transistor pair of a second conductivity type different from the first conductivity type, of which transistor pair receives the differential input signals; a second output stage connected to the second input stage; and an output terminal. The second output stage is structured with a circuit topology in which transistors of the first conductivity type in the first output stage are replaced with transistors of the second conductivity type, transistors of the second conductivity type in the first output stage are replaced with transistors of the first conductivity type, ground terminals in the first output stage are replaced with power supply terminals, and power supply terminals in the first output stage are replaced with ground terminals. The output terminal is commonly connected to outputs of the first and second output stages.

18 Claims, 3 Drawing Sheets

DIFFERENTIAL AMPLIFIER WITH SYMMETRIC CIRCUIT TOPOLOGY

INCORPORATION BY REFERENCE

This application claims the benefit of priority based on Japanese Patent Application No. 2007-329146, filed on Dec. 20, 2007 and Japanese Patent Application No. 2008-285481, filed on Nov. 6, 2008, and the disclosures of which are incorporated herein by reference.

BACKGROUND OF THE INVENTION

1. Field of the Invention

The present invention relates to a differential amplifier circuit and particularly a differential amplifier circuit having two input stages including transistors of different conductivity types.

2. Description of the Related Art

Dimensions of MOSFETs realized on LSIs are continuously reduced due to the progress in the LSI fabrication technique in recent years, and this results in the decrease of maximum voltage applicable to the MOSFETs. Furthermore, a requirement for the power supply voltage reduction has been increasing in various mobile electronic apparatuses as a result of increased performance requirements and demands with respect to the mobile electronic apparatuses, the progress made in batteries and peripheral components, and the social needs to save energy.

The reduction in the power supply voltage undesirably makes it more difficult to operate and design electronic circuits of electronic apparatuses. One problem is that the allowed input voltage range of enhancement type NMOS or PMOS FETs, which are widely used in an LSI with the CMOS configuration, is limited. In detail, an enhancement type FET has an invalid voltage range in which the output current is not turned on (such characteristics are often called normally-off) More specifically, an NMOS transistor can work with an input voltage higher than the threshold voltage thereof, whereas a PMOS transistor can work with an input voltage lower than the negative threshold voltage which is obtained by reducing the threshold voltage from the power supply voltage. In contrast, the ratio of the threshold voltage with respect to the power supply voltage increases when the power supply voltage is reduced; this implies that the ratio of the prohibited voltage range with respect to the power supply voltage increases. Otherwise, a signal voltage in the circuit is reduced below the threshold voltage level, resulting in a malfunction of the circuit.

One promising approach to solve this problem is to incorporate both of an input transistor pair of NMOS transistors and an input transistor pair of PMOS transistors in a differential amplifier circuit. FIG. 1 is a circuit diagram showing a typical configuration of a differential amplifier circuit such structured. The circuit configuration of FIG. 1 is disclosed by Behzad Razavi in "Design of Analog CMOS Integrated Circuits", McGraw-Hill, 2002, pp. 326, for example.

A differential amplifier circuit 100 of FIG. 1 includes an N-type input stage 101, a P-type input stage 102 and an output stage 103. The N-type input stage 101 includes NMOS transistors M11 to M13, and the P-type input stage 102 includes PMOS transistors M14 to M16. The NMOS transistor M12 and the PMOS transistor M14 are connected to a non-inverted input terminal IP which receives one of differential input signals (i.e. non-inverted input signal), while the NMOS transistor M13 and the PMOS transistor M15 are connected to an inverted input terminal IM which receives the other differential input signal (i.e. inverted input signal). That is, the NMOS transistors M12 and M13 in the N-type input stage 101 constitute a NMOS transistor pair which receives the differential input signals, while the PMOS transistors M14 and M15 in the P-type input stage 102 constitute a PMOS transistor pair which receive the differential input signals.

The output stage 103 includes NMOS transistors M17 to M1A and PMOS transistors M1B to M1E. The nodes N11 and N12 in the output stage 103 are connected to drains of the PMOS transistors M14 and M15 in the P-type input stage 102, respectively, while the nodes N14 and N15 in the output stage 103 are connected to the drains of the NMOS transistors M12 and M13 in the N-type input stage 101, respectively. The output stage 103 outputs from the output terminal OUT an output signal corresponding to the differential input signals fed to the N-type input stage 101 and the P-type input stage 102.

Enhancement type transistors (which are normally-off) may be used for the NMOS transistors and the PMOS transistors in the differential amplifier circuit 100.

In the differential amplifier circuit 100 of FIG. 1, the N-type input stage 101, which is configured with the NMOS transistors M12 and M13, is allowed to receive an input voltage equal to or higher than the threshold voltage of the NMOS transistors, whereas the P-type input stage 102, which is configured with the PMOS transistors M14 and M15, is allowed to receive an input voltage equal to or lower than the voltage which is obtained by reducing the threshold voltage of the PMOS transistors from the power supply voltage. Accordingly, the differential amplifier circuit 100 of FIG. 1 is capable of handling an input voltage in the entire voltage range from ground to the power supply voltage.

However, the inventor of the present invention has found a problem that the offset voltage of the differential amplifier circuit 100 of FIG. 1 is not set to zero. A detail discussion is given of this problem in the following. In the following discussion, all the MOS transistors in the differential amplifier circuit 100 are assumed to be operated in the saturation region unless it is explicitly stated otherwise. It should be noted that the assumption that all the MOS transistors are operated in the saturation region does not make a substantial inaccuracy from the actual operation of the differential amplifier circuit 100 for the purpose of the explanation of the concept of the circuit operation.

In general, the drain current ID of a MOS transistor is expressed by the following Equation (1):

$$ID = \frac{\mu C_{ox}}{2} \cdot \frac{W}{L} \cdot (V_{GS} - V_{th})^2 \cdot \left(1 + \frac{V_{DS}}{V_A}\right) \quad (1)$$

where μ is carrier mobility in the channel, Cox is the gate capacitance per unit area, W is the gate width, L is the gate length, VGS is the gate-source voltage, Vth is the threshold voltage, VDS is the drain-source voltage, and VA is the Early voltage.

For easy analysis and understanding of the circuit, all the NMOS transistors and PMOS transistors are assumed to have the same gain factor β (=μCox*W/L), the same threshold voltage Vth and the same Early voltage VA in the following. The following notations are defined:

Ix: the drain current of the MOS transistor Mx (x =11 to 1E);

VGSx: the gate-to-source voltage of the MOS transistor Mx;

VDSx: the drain-to-source voltage of the MOS transistor Mx;
VNy: the voltage level of the node Ny (y=13);
VIP: the voltage level of the non-inverted input signal (i.e. the voltage level of the non-inverted input terminal IP);
VIM: the voltage level of the inverted input signal (i.e. the voltage level of the inverted input terminal IM); and
VO: the output voltage (i.e. the voltage level of the output terminal OUT).

In the differential amplifier circuit 100 of FIG. 1, the offset voltage of zero means that the following Equation (2) is established if VIP is equal to VIM:

$$VO = VDD/2, \quad (2)$$

where VDD is the power supply voltage.

The output voltage VO is expressed by the following Equation (3) which is derived from Equation (1):

$$\begin{aligned}
VO &= Rout \cdot (I1C - I1A) + \frac{VDD}{2} \quad (3) \\
&= Rout \cdot \left(I1B \cdot \frac{VDD - VO}{VDD - VN13} - I19 \cdot \frac{VO}{VN13}\right) + \frac{VDD}{2} \\
&= Rout \cdot \left(\frac{VDD - VO}{VDD - VN13} - \frac{VO}{VN13}\right) \cdot I1B + \frac{VDD}{2} \\
&\approx Rout \cdot \left(\frac{VDD - VO}{VDD - VN17} - \frac{VO}{Vth17}\right) \cdot I1B + \frac{VDD}{2}
\end{aligned}$$

where Rout is the output resistance of the differential amplifier circuit 100 measured from the output terminal OUT.

The first term of Equation (3) is not reduced down to zero even when the transistors in the differential amplifier circuit 100 have the same properties. That is, even when the properties of the PMOS transistors M14 and M15 in the P-type input stage 102 are exactly identical, the properties of the NMOS transistors M12 and M13 in the N-type input stage 101 are exactly identical, and the threshold voltages of the PMOS transistors and the NMOS transistors are exactly identical, Equation (2) is not established as an identical equation; Equation (2) is established only in a special case where Vth17=VO. In other words, the offset voltage of the differential amplifier circuit shown in FIG. 1 is not always set to zero. When the properties of the transistors therein are not identical (e.g. the input stages include transistors with different properties), the offset voltage further deviates from zero.

SUMMARY

The inventor has discovered that one origin of the non-zero offset voltage of the circuit shown in FIG. 1 is the circuit structure asymmetry of the differential amplifier circuit 100, especially the circuit structure asymmetry of the output stage 103, which includes the MOS transistors M17 to M1E, with respect to the transistor conductivity type. According to the inventor's study, the offset voltage can be reduced, ideally to zero, through resolving the asymmetry of the circuit structure.

In an aspect of the present invention, a differential amplifier circuit is provided with a first input stage including a transistor pair of a first conductivity type, of which transistor pair receives differential input signals; a first output stage connected to the first input stage; a second input stage including a transistor pair of a second conductivity type different from the first conductivity type, of which transistor pair receives the differential input signals; a second output stage connected to the second input stage; and an output terminal. The second output stage is structured with a circuit topology in which transistors of the first conductivity type in the first output stage are replaced with transistors of the second conductivity type, transistors of the second conductivity type in the first output stage are replaced with transistors of the first conductivity type, ground terminals in the first output stage are replaced with power supply terminals, and power supply terminals in the first output stage are replaced with ground terminals. The output terminal is commonly connected to outputs of the first and second output stages.

The differential amplifier circuit thus constructed effectively reduces the offset voltage thereof, ideally down to zero.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERABLE EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
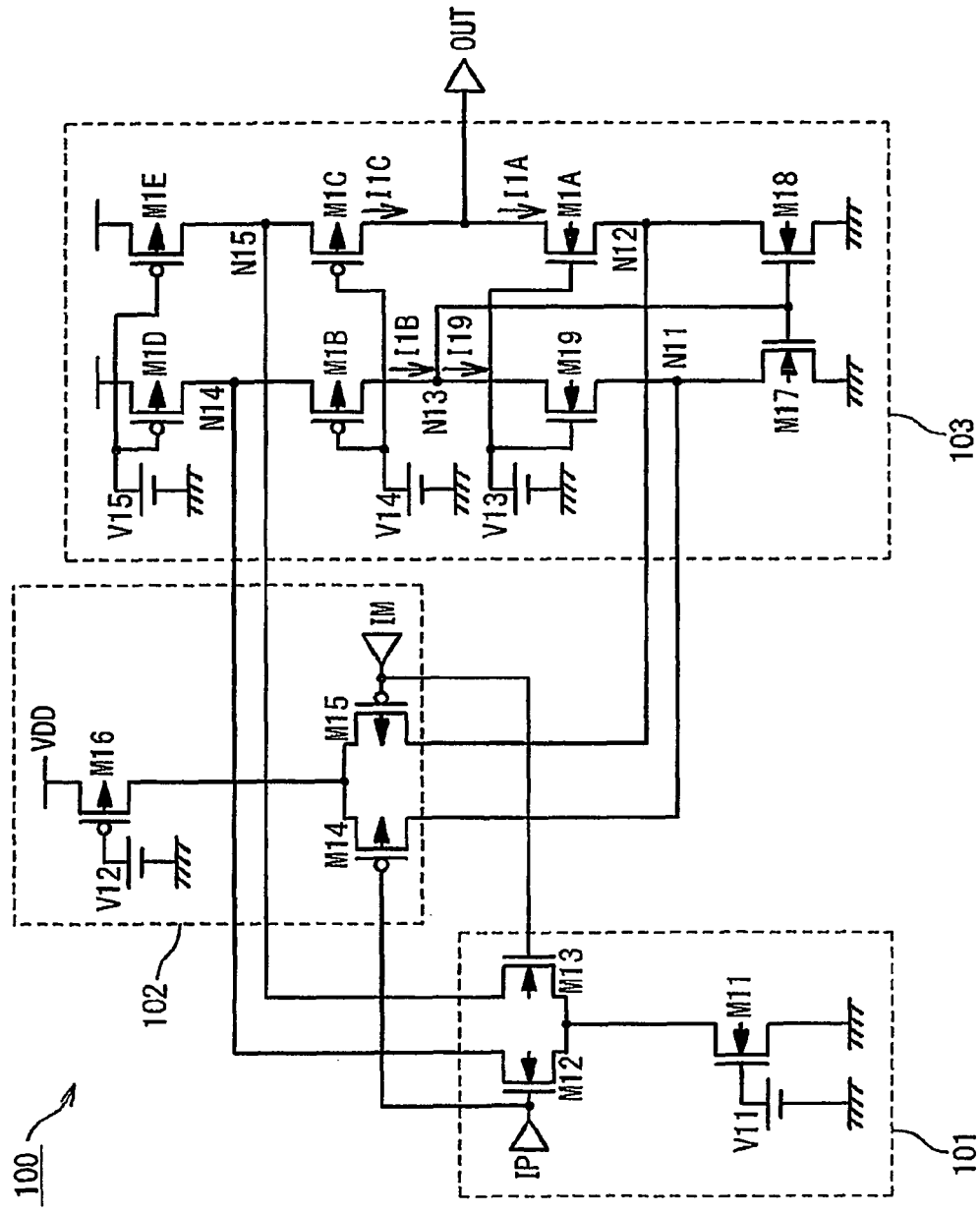
FIG. 1 is a circuit diagram showing the configuration of a conventional differential amplifier circuit.
Figure 2:
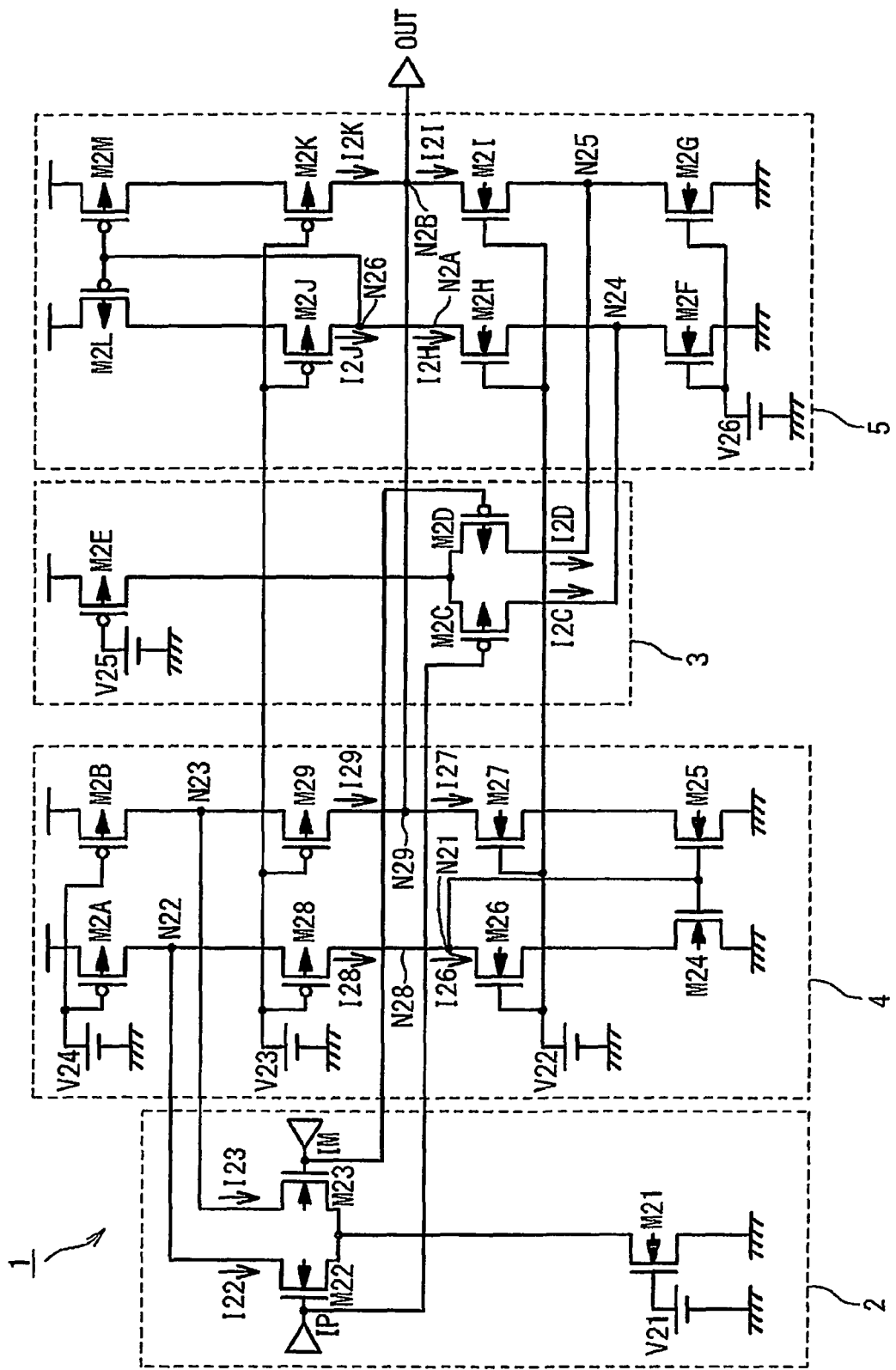
FIG. 2 is a circuit diagram showing an exemplary configuration of a differential amplifier circuit in a first embodiment of the present invention.

FIG. 2 is a circuit diagram showing an exemplary configuration of a differential amplifier circuit 1 in a first embodiment of the present invention. The differential amplifier circuit 1 includes an N-type input stage 2, a P-type input stage 3 and output stages 4 and 5.

The N-type input stage 2 includes NMOS transistors M21 to M23. The NMOS transistors M22 and M23 form a source-connected differential transistor pair. That is, the gate of the NMOS transistor M22 is connected to a non-inverted input terminal IP to which one of differential input signals (i.e. non-inverted input signal) is fed, while the gate of the NMOS transistor M23 is connected to an inverted input terminal IM to which the other differential input signal (i.e. the inverted input signal) is fed. The sources of the NMOS transistors M22 and M23 are commonly connected to the drain of the NMOS transistor M21. The NMOS transistor M21 receives a bias voltage V21 on the gate, functioning as a constant current source which supplies a constant current to the differential transistor pair configured with the NMOS transistors M22 and M23. The bias voltage V21 is set slightly higher than the threshold voltage of the NMOS transistor M21 to thereby feed a sufficient drain current through the NMOS transistor M21.

The P-type input stage 3 includes PMOS transistors M2C to M2E. The PMOS transistors M2C and M2D function as a pair of differential transistors with commonly-connected sources. That is, the gate of the PMOS transistor M2C is connected to the non-inverted input terminal IP to which the non-inverted input signal is fed, while the gate of the PMOS transistor M2D is connected to the inverted input terminal IM to which the inverted input signal is fed. The sources of the PMOS transistors M2C and M2D are connected to the drain of the PMOS transistor M2E. The PMOS transistor M2E receives a bias voltage V25 on the gate, functioning as a constant current source which supplies a constant current to the differential transistor pair configured with the PMOS transistors M2C and M2D. The bias voltage V25 is set slightly lower than the voltage obtained by reducing a threshold voltage of the PMOS transistor M2E from a power supply voltage VDD, to thereby feed a sufficient drain current through the PMOS transistor M2E.

The output stage 4, which includes NMOS transistors M24 to M27 and PMOS transistors M28 to M2B, is connected to the N-type input stage 2. The output stage 4 is configured as a folded cascode current mirror which generates on a node N29 an output signal corresponding to drain currents I22 and I23 through the NMOS transistors M22 and M23 in the N-type input stage 2.

Correspondingly, the output stage 5, which includes NMOS transistors M2F to M2I and PMOS transistors M2J to M2M, is connected to the P-type input stage 3. The output stage 5 is also configured as a folded cascode current mirror which generates on a node N2B an output signal corresponding to drain currents I2C and I2D through the PMOS transistors M2C and M2D in the P-type input stage 3.

The output stages 4 and 5 are each fed with three bias voltages. More specifically, bias voltages V22, V23 and V24 are supplied to the output stage 4, while bias voltages V22, V23 and V26 are supplied to the output stage 5. It should be noted that the bias voltages V22 and V23 are supplied to both of the output stages 4 and 5.

The bias voltage V22 is set to a predetermined voltage slightly higher than the threshold voltage of the NMOS transistors M26, M27, M2H and M2I (with the ground level GND defined as zero volts), and determined so that sufficient drain currents flow through the NMOS transistors M26, M27, M2H and M2I. More specifically, the bias voltage V22 is set to a voltage expressed by the following equation:

$$V22 = V_{THN1} + V_{DS\_satN1} + \alpha_1,$$

where $V_{THN1}$ is the threshold voltage of the NMOS transistors M26, M27, M2H and M2I, $V_{DS\_satN1}$ is the drain-source saturation voltage of the NMOS transistors M24, M25, M2F and M2G, and $\alpha_1$ is a voltage higher than zero volts. The bias voltage V22 is supplied to the gates of the NMOS transistors M26, M27, M2H and M2I.

On the other hand, the bias voltage V23 is set to a predetermined voltage slightly lower than the voltage which is obtained by reducing the threshold voltage of the PMOS transistors M28, M29, M2J and M2K from the power supply voltage VDD, and determined so that sufficient drain currents flow through the PMOS transistors M28, M29, M2J and M2K. More specifically, the bias voltage V23 is set to a voltage expressed by the following equation:

$$V23 = VDD - (V_{THP1} + V_{DS\_satP1} + \alpha_2),$$

where $V_{THP1}$ is the threshold voltage of the PMOS transistors M28, M29, M2J and M2K, $V_{DS\_satP1}$ is the drain-source saturation voltage of the PMOS transistors M2A, M2B, M2L and M2M, and $\alpha_2$ is a voltage higher than zero volts.

Furthermore, the bias voltage V24 is a predetermined voltage slightly lower than the voltage which is obtained by reducing the threshold voltage of the PMOS transistors M2A and M2B from the power supply voltage VDD, and determined so that sufficient drain currents flow through the PMOS transistors M2A and M2B. More specifically, the bias voltage V24 is the voltage expressed by the following equation:

$$V24 = VDD - (V_{THP2} + \alpha_3),$$

where $V_{THP2}$ is the threshold voltage of the PMOS transistors M2A and M2B and $\alpha_3$ is a voltage higher than zero volt.

Finally, the bias voltage V26 is set to a predetermined voltage slightly higher than the threshold voltage of the NMOS transistors M2F and M2G, and determined so that sufficient drain currents flow through the NMOS transistors M2F and M2G. More specifically, the bias voltage V26 is set to a voltage expressed by the following equation:

$$V26 = V_{THN2} + \alpha_4,$$

where $V_{THN2}$ is the threshold voltage of the NMOS transistors M2F and M2G and $\alpha_4$ is a voltage larger than zero.

The output terminal of the differential amplifier circuit 1 is commonly connected to the node N29 which is the output node of the output stage 4 and the node N2B which is the output node of the output stage 5. The derived signal from the output terminal OUT is an output signal corresponding to the differential input signals fed to the input terminals IP and IM.

It should be noted that enhancement type transistor (in a normally-off mode) may be used as the MOS transistors integrated in the differential amplifier circuit 1 of FIG. 2.

Emphasis is placed on the fact that the circuit configuration of the differential amplifier circuit 1 of this embodiment is symmetrical with respect to the transistor conductivity type (i.e. N-type and P-type). That is, the output stage 5 in the differential amplifier circuit 1 of this embodiment is structured with a circuit topology in which: (a) the NMOS transistors integrated in the output stage 4 are replaced with PMOS transistors; (b) the PMOS transistors integrated in the output stage 4 are replaced with NMOS transistors; (c) the ground terminals connected to the NMOS transistors in the output stage 4 are replaced with power supply terminals; and (d) the power supply terminals connected to the PMOS transistors in the output stage 4 with ground terminals. In addition, the predetermined bias voltages lower than the voltage obtained by reducing the threshold voltage of the PMOS transistors from the power supply voltage VDD are supplied to the PMOS transistors in the output stage 5 associated with the NMOS transistors to which the predetermined bias voltages higher than the threshold voltage of the NMOS transistors are supplied in the output stage 4. Correspondingly, the predetermined bias voltages higher than the threshold voltage of the NMOS transistors are supplied to the NMOS transistors in the output stage 5 associated with the PMOS transistors to which the predetermined bias voltages lower than the voltage obtained by reducing the threshold voltage of the PMOS transistors from the power supply voltage VDD are supplied in the output stage 4.

The correspondence between the output stages 4 and 5 are as follows: The output stage 5 is structured with a circuit topology in which: (a) the NMOS transistors M24 to M27 in the output stage 4 are replaced with the PMOS transistors M2L, M2M, M2J and M2K, respectively; (b) the PMOS transistors M28, M29, M2A and M2B are replaced with the NMOS transistors M2H, M2I, M2F and M2G, respectively; (c) the ground terminals connected to the NMOS transistors M24 and M25 are replaced with power supply terminals; and (d) the power supply terminals connected to the PMOS transistors M2A and M2B are replaced with the ground terminal.

In addition, the bias voltage V23 is supplied to the PMOS transistors M2J and M2K in the output stage 5, wherein the PMOS transistors M2J and M2K are associated with the NMOS transistors M26 and M27 in the output stage 4 to which the bias voltage V22 is supplied.

Furthermore, the bias voltage V22 is supplied to the NMOS transistors M2H and M2I in the output stage 5, wherein the NMOS transistors M2H and M2I are associated with the PMOS transistors M28 and M29 in the output stage 4 to which the bias voltage V23 is supplied. Finally, the bias voltage V26 is supplied to the NMOS transistors M2F and M2G in the output stage 5, wherein the NMOS transistors M2F and M2G are associated with the PMOS transistors M2A and M2B in the output stage 4 to which the bias voltage V24 is supplied.

Such configuration avoids circuit asymmetry of the output stages 4 and 5 with respect to the transistor conductivity type (i.e. N-type and P-type), and thereby effectively reducing the offset voltage. In principle, the configuration of the differential amplifier circuit 1 shown in FIG. 2 allows reducing the offset voltage set to zero. A description is given of the fact that the offset voltage is reduced down to zero in principle in the differential amplifier circuit 1 in the first embodiment.

The following discussion is based on an assumption that all the MOS transistors are operated in the saturation region in the same manner as the discussion given in the "Description of Related Art" section unless it is explicitly stated otherwise. It should be noted that the assumption that all the MOS transistors are operated in the saturation region does not make a substantial inaccuracy from the actual operation of the differential amplifier circuit 100 for the purpose of the explanation of the concept of the circuit operation.

For easy analysis and understanding of the circuit, all the NMOS transistors and PMOS transistors are assumed to have the same gain factor $\beta$ ($=\mu C_{ox} \cdot W/L$), the same threshold voltage Vth and the same Early voltage VA in the following. The following notations are further used:

Ix: the drain current of the MOS transistor Mx (x=21 to 2M);

VGSx: the gate-to-source voltage of the MOS transistor Mx;

VDSx: the drain-to-source voltage of the MOS transistor Mx;

VNy: the voltage level of the node Ny (y=21 and 26);

VIP: the voltage level of the non-inverted input signal (i.e. the voltage level of the non-inverted input terminal IP);

VIM: the voltage level of the inverted input signal (i.e. the voltage level of the inverted input terminal IM); and VO: the output voltage (i.e. the voltage level of the output terminal OUT).

The output voltage VO is obtained by following Equation (4):

$$VO = Rout \cdot (I29 - I27 + I2K - I21) + \frac{VDD}{2} \quad (4)$$

$$= Rout \cdot \left\{ \begin{array}{l} (I28 + I22 - I23) \cdot \frac{VDD-VO}{VDD-VN21} - \\ I26 \cdot \frac{VO}{VN21} + I2J \cdot \frac{VDD-VO}{VDD-VN26} - \\ (I2H + I2C - I2D) \cdot \frac{VO}{VN26} \end{array} \right\} + \frac{VDD}{2}$$

-continued $$= Rout \cdot \left\{ \begin{array}{l} (I28 + I22 - I23) \cdot \frac{VDD-VO}{VDD-VN21} - \\ I28 \cdot \frac{VO}{VN21} + I2H \cdot \frac{VDD-VO}{VDD-VN26} - \\ (I2H + I2C - I2D) \cdot \frac{VO}{VN26} \end{array} \right\} + \frac{VDD}{2}$$

where Rout is the output resistance of the differential amplifier circuit 1 measured from the output terminal OUT.

When VIP is equal to VIM, the following equation is established:

$$I22=I23=I2C=I2D, \quad (5)$$

and furthermore, the following equation (6) is established from Equation (4):

$$VO = Rout \cdot \left\{ \frac{VDD-VO}{VDD-VN21} - \frac{VO}{VN21} + \frac{VDD-VO}{VDD-VN26} - \frac{VO}{VN26} \right\} \cdot I28 + \frac{VDD}{2} \quad (6)$$

$$\approx Rout \cdot \left\{ \frac{VDD-VO}{VDD-Vth24} - \frac{VO}{Vth24} + \frac{VDD-VO}{Vth2L} - \frac{VO}{VDD-Vth2L} \right\} \cdot I28 + \frac{VDD}{2}$$

$$= Rout \cdot \left\{ \frac{VDD-2VO}{VDD-Vth24} + \frac{VDD-2VO}{Vth24} \right\} \cdot I28 + \frac{VDD}{2}$$

When it holds for the Equation (6):

$$VO=VDD/2, \quad (7)$$

the first term of Equation (6) is zero, which implies that Equation (6) is established likewise without any contradictions. Accordingly, Equation (7) is established, with the offset voltage reduced down to zero volts.

Second Embodiment

Figure 3:
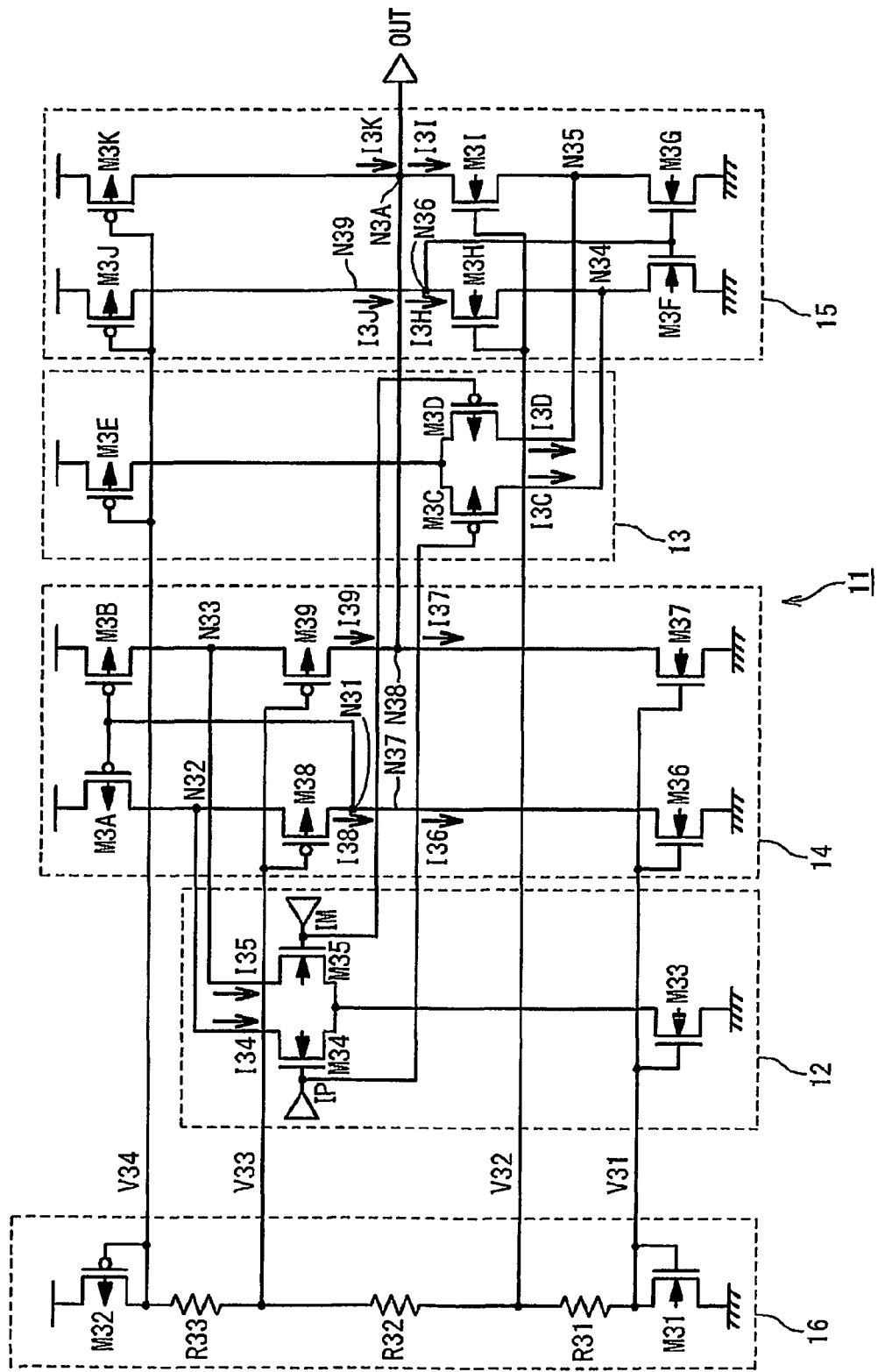
FIG. 3 is a circuit diagram showing an exemplary configuration of a differential amplifier circuit in a second embodiment of the present invention.

FIG. 3 is a circuit diagram showing an exemplary configuration of a differential amplifier circuit 11 according to a second embodiment of the present invention. The differential amplifier circuit 11 includes an N-type input stage 12, a P-type input stage 13, output stages 14 and 15, and a bias circuit 16. FIG. 2, which is related to the first embodiment which shows that the bias voltages V22 to V26 are supplied from the voltage sources, whereas FIG. 3, which is related to the second embodiment, shows a specific circuit configuration of the bias circuit 16 which supplies bias voltages V31 to V34.

More specifically, the N-type input stage 12 includes NMOS transistors M33 to M35. The NMOS transistors M34 and M35 form a source-connected differential transistor pair. That is,. the gate of the NMOS transistor M34 is connected to the non-inverted input terminal IP to which an non-inverted input signal is fed, while the gate of the NMOS transistor M35 is connected to the inverted input terminal IM to which an inverted input signal is fed. The sources of the NMOS transistors M34 and M35 are commonly connected to the drain of the NMOS transistor M33. The NMOS transistor M33 receives the bias voltage V31 on the gate, functioning as a constant current source which supplies a constant current to the differential transistor pair configured with the NMOS transistors M34 and M35.

The P-type input stage 13 includes PMOS transistors M3C to M3E. The PMOS transistors M3C and M3D form a commonly-connected differential transistor pair. That is, the gate of the PMOS transistor M3C is connected to the non-inverted input terminal IP to which the non-inverted input signal is fed, while the gate of the PMOS transistor M3D is connected to the inverted input terminal IM to which the inverted input signal is fed. The sources of the PMOS transistors M3C and M3D are commonly connected to the drain of the PMOS transistor M3E. The PMOS transistor M3E receives the bias voltage V34 on the gate, functioning as a constant current source which supplies a constant current to the differential transistor pair configured with the PMOS transistors M3C and M3D.

The output stage 14, which includes NMOS transistors M36 and M37 and PMOS transistors M38 to M3B, is connected to the N-type input stage 12. The output stage 14 is structured as a folded cascode current mirror, and generates on a node N38 an output signal corresponding to the drain currents I34 and I35 through the NMOS transistors M34 and M35 in the N-type input stage 12. Two bias voltages: the bias voltages V31 and V33 are supplied to the output stage 14. The bias voltage V31 is supplied to the gates of the NMOS transistors M36 and M37, while the bias voltage V33 is supplied to the gates of the PMOS transistors M38 and M39.

Similarly, the output stage 15, which includes NMOS transistors M3F to M3I and PMOS transistors M3J and M3K, is connected to the P-type input stage 13. The output stage 15 is also configured as a folded cascode current mirror which generates on a node N3A an output signal corresponding to the drain currents I3C and I3D through the PMOS transistors M3C and M3D in the P-type input stage 13. Two bias voltages: the bias voltages V32 and V34 are supplied to the output stage 15.

The voltage levels of the bias voltages V31 to V34 supplied to the N-type input stage 12, the P-type input stage 13 and the output stages 14 and 15 are adjusted as follows. Firstly, the bias voltage V31 is set to a predetermined voltage slightly higher than the threshold voltage of the NMOS transistors M33, M36 and M37, and determined so that sufficient drain currents flow through the NMOS transistors M33, M36 and M37. More specifically, the bias voltage V31 is set to a voltage expressed by the following equation:

$$V31 = V_{THN3} + \alpha_5,$$

where $V_{THN3}$ is the threshold voltage of the NMOS transistors M33, M36 and M37, and $\alpha_5$ is a voltage higher than zero volts. The bias voltage V31 is supplied to the gates of the NMOS transistors M33, M36 and M37.

The bias voltage V32 is set to a predetermined voltage slightly higher than a threshold voltage of the NMOS transistors M3H and M3I, and determined so that sufficient drain currents flow through the NMOS transistors M3H and M3I. More specifically, the bias voltage V32 is set to a voltage expressed by the following equation:

$$V32 = V_{THN4} + V_{DS\_satN2} + \alpha_6,$$

where $V_{THN4}$ is the threshold voltage of the NMOS transistors M3H and M3I, $V_{DS\_satN2}$ is the drain-source saturation voltage of the NMOS transistors M3F and M3G, and $\alpha_6$ is a voltage higher than zero volts. The bias voltage V32 is supplied to the gates of the NMOS transistors M3H and M3I.

Furthermore, the bias voltage V33 is set to a predetermined voltage slightly lower than the voltage which is obtained by reducing the threshold voltage of the PMOS transistors M38 and M39 from the power supply voltage VDD, and determined so that sufficient drain currents flow through the PMOS transistors M38 and M39. More specifically, the bias voltage V33 is set to a voltage expressed by the following equation:

$$V33 = VDD - (V_{THP3} + V_{DS\_satP2} + \alpha_7)$$

where $V_{THP3}$ is the threshold voltage of the PMOS transistors M38 and M39, $V_{DS\_satP2}$ is the drain-source saturation voltage of the PMOS transistors M3A and M3B, and $\alpha_7$ is a voltage higher than zero volts. The bias voltage V33 is supplied to the gates of the PMOS transistors M38 and M39.

Finally, the bias voltage V34 is set to a predetermined voltage slightly lower than the voltage which is obtained by reducing the threshold voltage of the PMOS transistors M3E, M3J and M3K from the power supply voltage VDD, and determined so that sufficient drain currents flow through the PMOS transistors M3E, M3J and M3K. More specifically, the bias voltage V34 is set to a voltage expressed by the following equation:

$$V34 = VDD - (V_{THP4} + \alpha_8),$$

where $V_{THP4}$ is the threshold voltage of the PMOS transistors M3E, M3J and M3K, and $\alpha_8$ is a voltage higher than zero volts. The bias voltage V34 is supplied to the gates of the PMOS transistors M3E, M3J and M3K.

The bias circuit 16 generates the aforementioned bias voltages V31 to V34. In this embodiment, the bias circuit 16 includes a diode-connected NMOS transistor M31, a diode-connected PMOS transistor M32 and resistance elements R31 to R33 which are connected in series between the drain of the NMOS transistor M31 and the drain of the PMOS transistor M32. The bias voltage V31 is generated on the drain of the NMOS transistor M31, while the bias voltage V32 is generated on the connection node between the resistance elements R31 and R32. Furthermore, the bias voltage V33 is generated on the connection node between the resistance elements R32 and R33, while the bias voltage V34 is generated on the drain of the PMOS transistor M32. The following relationship is established among the bias voltages V31 to V34:

$$GND < V31 < V32 < V33 < V34 < VDD.$$

The output terminal OUT of the differential amplifier circuit 11 is connected to the node N38, which is the output node of the output stage 14, and also connected to the node N3A, which is the output node of the output stage 15. An output signal corresponding to the differential input signals fed to the input terminals IP and IM is derived from the output terminal OUT.

It should be noted that enhancement type transistors (which are normally-off) may be used for the MOS transistors in the differential amplifier circuit 11 of FIG. 3.

The differential amplifier circuit 11 of the second embodiment is also designed with a symmetrical circuit topology with respect to the transistor conductivity type (i.e. N-type and P-type) in the same manner as the first embodiment. That is, the output stage 15 in the differential amplifier circuit 11 of the second embodiment is structured with a circuit topology in which: (a) the NMOS transistors included in the output stage 14 are replaced with PMOS transistors; (b) the PMOS transistors included in the output stage 14 are replaced with NMOS transistors; (c) the ground terminals connected to the NMOS transistors in the output stage 14 are replaced with power supply terminals; and (d) the power supply terminals connected to the PMOS transistors in the output stage 14 are replaced with ground terminals. In addition, the bias voltage V34 slightly lower than the voltage obtained by reducing the threshold voltage from the power supply voltage VDD is supplied to the PMOS transistors M3J and M3K in the output stage 15 associated with the NMOS transistors M36 and M37 in the output stage 14 to which the bias voltage V31 slightly higher than the threshold voltage is supplied. Furthermore, the bias voltage V32, which is slightly higher than the threshold voltage, is supplied to the NMOS transistors M3H and M3I in the output stage 15 associated with the PMOS transistors M38 and M39 in the output stage 14 to which the bias voltage V33 slightly lower than the voltage obtained by reducing a threshold voltage from the power supply voltage VDD is supplied.

In such configuration, the circuit configurations of the output stages 14 and 15 are symmetrical with respect to the transistor conductivity type (i.e. N-type and P-type), and thereby the offset voltage is reduced. In principle, the configuration of the differential amplifier circuit 11 shown in FIG. 3 allows reducing the offset voltage set to zero. In the following, a description is given of the fact that the offset voltage can be reduced down to zero in principle in the differential amplifier circuit 11 according to the second embodiment.

As is the case of the discussion given in the first embodiment, the following discussion is based on an assumption that all the MOS transistors are operated in the saturation region and all the NMOS transistors and PMOS transistors have the same gain factor β (=μCox·W/L), the same threshold voltage Vth and the same Early voltage VA, unless it is explicitly stated otherwise. Notations similar to those of the first embodiment are also used in the following.

The output voltage VO is obtained by the following Equation (8):

$$VO = Rout \cdot (I39 - I37 + I3K - I3I) + \frac{VDD}{2} \quad (8)$$

$$= Rout \cdot \left\{ \begin{array}{l} (I38 + I34 - I35) \cdot \frac{VDD - VO}{VDD - VN31} - \\ I36 \cdot \frac{VO}{VN31} + I3J \cdot \frac{VDD - VO}{VDD - VN36} - \\ (I3H + I3C - I3D) \cdot \frac{VO}{VN36} \end{array} \right\} + \frac{VDD}{2}$$

$$= Rout \cdot \left\{ \begin{array}{l} (I38 + I34 - I35) \cdot \frac{VDD - VO}{VDD - VN31} - \\ I38 \cdot \frac{VO}{VN31} + I3H \cdot \frac{VDD - VO}{VDD - VN36} - \\ (I3H + I3C - I3D) \cdot \frac{VO}{VN36} \end{array} \right\} + \frac{VDD}{2}$$

where Rout is the output resistance of the differential amplifier circuit 11 measured from the output terminal OUT.

When VIP is equal to VIM, the following equation is established:

$$I34=I35=I3C=I3D, \quad (9)$$

and furthermore, Equation (10) is established from Equation (8):

$$VO = Rout \cdot \left\{ \begin{array}{l} \frac{VDD - VO}{VDD - VN31} - \frac{VO}{VN31} + \\ \frac{VDD - VO}{VDD - VN36} - \frac{VO}{VN36} \end{array} \right\} \cdot I38 + \frac{VDD}{2} \quad (10)$$

$$\approx Rout \cdot \left\{ \begin{array}{l} \frac{VDD - VO}{Vth3A} - \frac{VO}{VDD - Vth3A} + \\ \frac{VDD - VO}{VDD - Vth3F} - \frac{VO}{Vth3F} \end{array} \right\} \cdot I38 + \frac{VDD}{2}$$

$$= Rout \cdot \left\{ \frac{VDD - 2VO}{VDD - Vth3A} + \frac{VDD - 2VO}{Vth3A} \right\} \cdot I38 + \frac{VDD}{2}$$

When it holds for Equation (10):

$$VO=VDD/2, \quad (11)$$

the first term of Equation (10) is zero, which implies that Equation (10) is established without any contradictions. Accordingly, Equation (11) is established and the offset voltage is reduced down to zero volts.

In summary, the differential amplifier circuits of the above-described embodiments of the present invention has a symmetrical circuit configuration with respect to the transistor conductivity type (i.e. N-type and P-type), and this effectively reduces the offset voltage, ideally down to zero volts in principle.

It is apparent that the present invention is not limited to the above embodiments, but may be modified and changed without departing from the scope of the invention. For example, although cascode current mirrors are used as common-mode feedback means in the differential amplifier circuits shown in FIGS. 2 and 3, other common-mode feedback means may be used instead.

It should be additionally noted that the present invention is also applicable to a differential amplifier circuit comprised of bipolar transistors. The use of a symmetrical circuit configuration with respect to the transistor conductivity type (i.e. NPN and PNP) is also effective in a differential amplifier circuit comprised of bipolar transistors for reducing the offset voltage, ideally down to zero. It should be further noted that the present invention is also applicable to a differential amplifier circuit comprised of other kind of transistors, such as junction FETs.

What is claimed is:
1. A differential amplifier circuit, comprising:
a first input stage including a transistor pair of a first conductivity type, said transistor pair receiving differential input signals;
a first output stage connected to said first input stage;
a second input stage including a transistor pair of a second conductivity type different from said first conductivity type, said transistor pair receiving said differential input signals;
a second output stage connected to said second input stage; and
an output terminal,
wherein said second output stage is structured with a circuit topology symmetric to a circuit topology of said first output stage such that transistors of said first conductivity type in said first output stage are replaced with transistors of said second conductivity type in said second output stage, transistors of said second conductivity type in said first output stage are replaced with transistors of said first conductivity type in said second output stage, ground terminals in said first output stage are replaced with power supply terminals in said second output stage, and power supply terminals in said first output stage are replaced with ground terminals in said second output stage,
outputs of said first and second output stages are commonly connected to said output terminal,
said first input stage includes first and second NMOS transistors having commonly connected sources,
said second input stage includes first and second PMOS transistors having commonly connected sources, one of said differential input signals is fed to the gates of said first NMOS transistor and said first PMOS transistor, the other of said differential input signals is fed to the gates of said second NMOS transistor and said second PMOS transistor, said first output stage includes:
  third to sixth NMOS transistors; and
  third to sixth PMOS transistors, said third and fourth NMOS transistors have sources connected to ground and commonly-connected gates, said fifth NMOS transistor has a source connected to the drain of said third NMOS transistor and a drain connected to the gates of said third and fourth NMOS transistors and to a first node, said sixth NMOS transistor has a source connected to the drain of said fourth NMOS transistor and a drain connected to a second node, a first bias voltage is fed to the gates of said fifth and sixth NMOS transistors, said third PMOS transistor has a drain connected to said first node, and a source connected to the drain of said first NMOS transistor, said fourth PMOS transistor has a drain connected to said second node, and a source connected to the drain of said second NMOS transistor, a second bias voltage is fed to the gates of said third and fourth PMOS transistors, said fifth PMOS transistor has a drain connected to the source of said third PMOS transistor, and a source connected to a power supply terminal, said sixth PMOS transistor has a drain connected to the source of said fourth PMOS transistor, and a source connected to a power supply terminal, a third bias voltage is fed to the gates of said fifth and sixth PMOS transistors, said second output stage includes:
  seventh to tenth PMOS transistors; and
  seventh to tenth NMOS transistors, said seventh and eighth PMOS transistors have sources connected to power supply terminals and commonly-connected gates, said ninth PMOS transistor has a source connected to the drain of said seventh NMOS transistor and a drain connected to the gates of said seventh and eighth PMOS transistors and to a third node, said tenth PMOS transistor has a source connected to the drain of said eighth PMOS transistor and a drain connected to a fourth node, said second bias voltage is fed to the gates of said ninth and tenth PMOS transistors, said seventh NMOS transistor has a drain connected to said third node, and a source connected to the drain of said first PMOS transistor, said eighth NMOS transistor has a drain connected to said fourth node, and a source connected to the drain of said second PMOS transistor, said first bias voltage is fed to the gates of said seventh and eighth NMOS transistors, said ninth NMOS transistor has a drain connected to the source of said seventh NMOS transistor, and a source connected to ground, said tenth NMOS transistor has a drain connected to the source of said eighth NMOS transistor, and a source connected to ground, a fourth bias voltage is fed to the gates of said ninth and tenth NMOS transistors, and said output terminal is connected to said second node of said first output stage and said fourth node of said second output stage.

2. The differential amplifier circuit according to claim 1, wherein said first conductivity type is N-type, and said second conductivity type is P-type, wherein P-type transistors of said second output stage corresponding to N-type transistors of said first output stage which are fed with a predetermined bias voltage higher than a threshold voltage thereof are fed with a predetermined bias voltage lower than a voltage obtained by reducing a threshold voltage thereof from a power supply voltage, and N-type transistors of said second output stage corresponding to P-type transistors of said first output stage which are fed with a predetermined bias voltage lower than a voltage obtained by reducing a threshold voltage thereof from a power supply voltage are fed with a predetermined bias voltage higher than a threshold voltage thereof.

3. A differential amplifier circuit, comprising:

a first input stage including a transistor pair of a first conductivity type, said transistor pair receiving differential input signals;

a first output stage connected to said first input stage;

a second input stage including a transistor pair of a second conductivity type different from said first conductivity type, said transistor pair receiving said differential input signals;

a second output stage connected to said second input stage; and an output terminal, wherein said second output stage is structured with a circuit topology symmetric to a circuit topology of said first output stage such that transistors of said first conductivity type in said first output stage are replaced with transistors of said second conductivity type in said second output stage, transistors of said second conductivity type in said first output stage are replaced with transistors of said first conductivity type in said second output stage, ground terminals in said first output stage are replaced with power supply terminals in said second output stage, and power supply terminals in said first output stage are replaced with ground terminals in said second output stage, said first input stage includes first and second NMOS transistors having commonly connected sources, said second input stage includes first and second PMOS transistors having commonly connected sources, one of said differential input signals is fed to the gates of said first NMOS transistor and said first PMOS transistor, the other of said differential input signals is fed to the gates of said second NMOS transistor and said second PMOS transistor, said first output stage includes:
  third and fourth NMOS transistors; and
  third to sixth PMOS transistors, said third NMOS transistor has a source connected to ground and a drain connected to a first node, said fourth NMOS transistor has a source connected to ground and a drain connected to a second node, a first bias voltage is fed to the gates of said third and fourth NMOS transistors, said third PMOS transistor has a drain connected to said first node and a source connected to the drain of said first NMOS transistor, said fourth PMOS transistor has a drain connected to said second node and a source connected to the drain of said second NMOS transistor, a second bias voltage is fed to the gates of said third and fourth PMOS transistors, said fifth PMOS transistor has a drain connected to the source of said third PMOS transistor, and a source connected to a power supply terminal, said sixth PMOS transistor has a drain connected to the source of said fourth PMOS transistor and a source connected to a power supply terminal, the gates of said fifth and sixth PMOS transistors are commonly connected to the drain of said third PMOS transistor, said second output stage includes:
  seventh and eighth PMOS transistors; and
  fifth to eighth NMOS transistors, said seventh PMOS transistor has a source connected to a power supply terminal and a drain connected to a third node, said eighth PMOS transistor has a source connected to a power supply terminal and a drain connected to a fourth node, a third bias voltage is fed to the gates of said seventh and eighth PMOS transistors, said fifth NMOS transistor has a drain connected to said third node, and a source connected to the drain of said first PMOS transistor, said sixth NMOS transistor has a drain connected to said fourth node, and a source connected to the drain of said second PMOS transistor, a fourth bias voltage is fed to the gates of said fifth and sixth NMOS transistors, said seventh NMOS transistor has a drain connected to the source of said fifth NMOS transistor and a source connected to ground, said eighth NMOS transistor has a drain connected to the source of said sixth NMOS transistor and a source connected to ground, the gates of said seventh and eighth NMOS transistors are commonly connected to the drain of said fifth NMOS transistor, and said output terminal is connected to said second node of said first output stage and said fourth node of said second output stage.

4. The differential amplifier circuit according to claim 3, wherein said fourth bias voltage is higher than said first bias voltage, said second vias voltage is higher than said fourth bias voltage, and said third vias voltage is higher than said second vias voltage.

5. The differential amplifier circuit according to claim 3, wherein said first conductivity type is N-type, and said second conductivity type is P-type, wherein P-type transistors of said second output stage corresponding to N-type transistors of said first output stage which are fed with a predetermined bias voltage higher than a threshold voltage thereof are fed with a predetermined bias voltage lower than a voltage obtained by reducing a threshold voltage thereof from a power supply voltage, and N-type transistors of said second output stage corresponding to P-type transistors of said first output stage which are fed with a predetermined bias voltage lower than a voltage obtained by reducing a threshold voltage thereof from a power supply voltage, are fed with a predetermined bias voltage higher than a threshold voltage thereof.

6. A differential amplifier circuit, comprising:
a first input stage including a transistor pair of a first conductivity type, said transistor pair receiving differential input signals;
a first output stage connected to said first input stage;
a second input stage including a transistor pair of a second conductivity type different from said first conductivity type, said transistor pair receiving said differential input signals;
a second output stage connected to said second input stage; and
an output terminal,
wherein said second output stage is structured with a circuit topology symmetric to a circuit topology of said first output stage such that transistors of said first conductivity type in said first output stage are replaced with transistors of said second conductivity type in said second output stage, transistors of said second conductivity type in said first output stage are replaced with transistors of said first conductivity type in said second output stage, ground terminals in said first output stage are replaced with power supply terminals in said second output stage, and power supply terminals in said first output stage are replaced with ground terminals in said second output stage,
wherein outputs of said first and second output stages are commonly connected to said output terminal, and
wherein said symmetric topologies in said first and second output stages includes transistors configured to provide an offset voltage for said differential amplifier circuit of substantially zero volts.

7. The differential amplifier circuit according to claim 6, wherein said first conductivity type is N-type, and said second conductivity type is P-type, wherein P-type transistors of said second output stage corresponding to N-type transistors of said first output stage which are fed with a predetermined bias voltage higher than a threshold voltage thereof are fed with a predetermined bias voltage lower than a voltage obtained by reducing a threshold voltage thereof from a power supply voltage, and N-type transistors of said second output stage corresponding to P-type transistors of said first output stage which are fed with a predetermined bias voltage lower than a voltage obtained by reducing a threshold voltage thereof from a power supply voltage, are fed with a predetermined bias voltage higher than a threshold voltage thereof.

8. The differential amplifier circuit according to claim 6, wherein said first input stage includes first and second NMOS transistors having commonly connected sources, said second input stage includes first and second PMOS transistors having commonly connected sources, one of said differential input signals is fed to gates of said first NMOS transistor and said first PMOS transistor, the other of said differential input signals is fed to gates of said second NMOS transistor and said second PMOS transistor, said first output stage includes:
  third to sixth NMOS transistors; and
  third to sixth PMOS transistors, said third and fourth NMOS transistors have sources connected to ground and commonly-connected gates, said fifth NMOS transistor has a source connected to a drain of said third NMOS transistor and a drain connected to gates of said third and fourth NMOS transistors and to a first node,
said sixth NMOS transistor has a source connected to a drain of said fourth NMOS transistor and a drain connected to a second node,
a first bias voltage is fed to gates of said fifth and sixth NMOS transistors,
said third PMOS transistor has a drain connected to said first node, and a source connected to a drain of said first NMOS transistor,
said fourth PMOS transistor has a drain connected to said second node, and a source connected to a drain of said second NMOS transistor,
a second bias voltage is fed to gates of said third and fourth PMOS transistors,
said fifth PMOS transistor has a drain connected to a source of said third PMOS transistor, and a source connected to a power supply terminal,
said sixth PMOS transistor has a drain connected to a source of said fourth PMOS transistor, and a source connected to a power supply terminal,
a third bias voltage is fed to gates of said fifth and sixth PMOS transistors,
said second output stage includes:
seventh to tenth PMOS transistors; and
seventh to tenth NMOS transistors,
said seventh and eighth PMOS transistors have sources connected to power supply terminals and commonly-connected gates,
said ninth PMOS transistor has a source connected to a drain of said seventh NMOS transistor and a drain connected to gates of said seventh and eighth PMOS transistors and to a third node,
said tenth PMOS transistor has a source connected to a drain of said eighth PMOS transistor and a drain connected to a fourth node,
said second bias voltage is fed to gates of said ninth and tenth PMOS transistors,
said seventh NMOS transistor has a drain connected to said third node, and a source connected to a drain of said first PMOS transistor,
said eighth NMOS transistor has a drain connected to said fourth node, and a source connected to a drain of said second PMOS transistor,
said first bias voltage is fed to gates of said seventh and eighth NMOS transistors,
said ninth NMOS transistor has a drain connected to a source of said seventh NMOS transistor, and a source connected to ground,
said tenth NMOS transistor has a drain connected to a source of said eighth NMOS transistor, and a source connected to ground,
a fourth bias voltage is fed to gates of said ninth and tenth NMOS transistors, and
said output terminal is connected to said second node of said first output stage and said fourth node of said second output stage.

9. The differential amplifier circuit according to claim 6, wherein said first input stage includes first and second NMOS transistors having commonly connected sources,
said second input stage includes first and second PMOS transistors having commonly connected sources,
one of said differential input signals is fed to gates of said first NMOS transistor and said first PMOS transistor,
the other of said differential input signals is fed to gates of said second NMOS transistor and said second PMOS transistor,
said first output stage includes:
third and fourth NMOS transistors; and
third to sixth PMOS transistors,
said third NMOS transistor has a source connected to ground and a drain connected to a first node,
said fourth NMOS transistor has a source connected to ground and a drain connected to a second node,
a first bias voltage is fed to gates of said third and fourth NMOS transistors,
said third PMOS transistor has a drain connected to said first node and a source connected to a drain of said first NMOS transistor,
said fourth PMOS transistor has a drain connected to said second node and a source connected to a drain of said second NMOS transistor,
a second bias voltage is fed to gates of said third and fourth PMOS transistors,
said fifth PMOS transistor has a drain connected to a source of said third PMOS transistor, and a source connected to a power supply terminal,
said sixth PMOS transistor has a drain connected to a source of said fourth PMOS transistor and a source connected to a power supply terminal,
gates of said fifth and sixth PMOS transistors are commonly connected to a drain of said third PMOS transistor,
said second output stage includes:
seventh and eighth PMOS transistors; and
fifth to eighth NMOS transistors,
said seventh PMOS transistor has a source connected to a power supply terminal and a drain connected to a third node,
said eighth PMOS transistor has a source connected to a power supply terminal and a drain connected to a fourth node,
a third bias voltage is fed to gates of said seventh and eighth PMOS transistors,
said fifth NMOS transistor has a drain connected to said third node, and a source connected to a drain of said first PMOS transistor,
said sixth NMOS transistor has a drain connected to said fourth node, and a source connected to a drain of said second PMOS transistor,
a fourth bias voltage is fed to gates of said fifth and sixth NMOS transistors,
said seventh NMOS transistor has a drain connected to a source of said fifth NMOS transistor and a source connected to ground,
said eighth NMOS transistor has a drain connected to a source of said sixth NMOS transistor and a source connected to ground,
gates of said seventh and eighth NMOS transistors are commonly connected to a drain of said fifth NMOS transistor, and
said output terminal is connected to said second node of said first output stage and said fourth node of said second output stage.

10. The differential amplifier circuit according to claim 9, wherein said fourth bias voltage is higher than said first bias voltage,
said second bias voltage is higher than said fourth bias voltage, and
said third bias voltage is higher than said second bias voltage.

11. The differentuial amplifier according to claim 6, wherein said first and second output stages each comprise a folded cascode current mirror.

12. The differential amplifier circuit according to claim 6, wherein bias voltages in said first and second output stages are symmetrically preset to provide substantially a zero offset voltage for said differential amplifier circuit.

13. The differential amplifier circuit according to claim 12, wherein said first output stage includes a plurality of bias voltages and said second output stage includes a corresponding plurality of bias voltages.

14. A differential amplifier circuit, comprising:
input terminals, to receive a differential input signal;
a first input stage including a transistor pair of a first conductivity type, said transistor pair receiving said differential input signal from said input terminals;
a first output stage, comprising a first folded cascode current mirror configuration, receiving an output of said first input stage and providing a first output stage output signal;
a second input stage including a transistor pair of a second conductivity type different from said first conductivity type, said transistor pair also receiving said differential input signal from said input terminals;
a second output stage, comprising a second folded cascode current mirror configuration, receiving an output of said second input stage and providing a second output stage output signal; and
an output terminal connected to receive said first and second output stage output signals,
wherein said second output stage is structured with a circuit topology symmetric to a circuit topology of said first output stage such that selected transistors of said first conductivity type in said first output stage are replaced with transistors of said second conductivity type in said second output stage, selected transistors of said second conductivity type in said first output stage are replaced with transistors of said first conductivity type in said second output stage, ground terminals in said first output stage are replaced with power supply terminals in said second output stage, and power supply terminals in said first output stage are replaced with ground terminals in said second output stage, and
wherein said symmetric topologies in said first and second output stages includes transistors configured to provide an offset voltage for said differential amplifier circuit of substantially zero volts, including bias voltages predetermined to provide said substantially zero volt offset voltage.

15. The differential amplifier circuit according to claim 14, wherein said first conductivity type is N-type, and said second conductivity type is P-type,
wherein P-type transistors, in said second output stage which is associated with N-type transistors in said first output stage fed with a predetermined bias voltage higher than a threshold voltage thereof, are fed with a predetermined bias voltage lower than a voltage obtained by reducing a threshold voltage thereof from a power supply voltage, and
N-type transistors, in said second output stage which is associated with P-type transistors in said first output stage fed with a predetermined bias voltage lower than a voltage obtained by reducing a threshold voltage thereof from a power supply voltage, are fed with a predetermined bias voltage higher than a threshold voltage thereof.

16. The differential amplifier circuit according to claim 14, wherein said first input stage includes first and second NMOS transistors having commonly connected sources,
said second input stage includes first and second PMOS transistors having commonly connected sources,
one of said differential input signals is fed to gates of said first NMOS transistor and said first PMOS transistor,
the other of said differential input signals is fed to gates of said second NMOS transistor and said second PMOS transistor,
said first output stage includes:
third to sixth NMOS transistors; and
third to sixth PMOS transistors,
said third and fourth NMOS transistors have sources connected to ground and commonly-connected gates,
said fifth NMOS transistor has a source connected to a drain of said third NMOS transistor and a drain connected to gates of said third and fourth NMOS transistors and to a first node,
said sixth NMOS transistor has a source connected to a drain of said fourth NMOS transistor and a drain connected to a second node,
a first bias voltage is fed to gates of said fifth and sixth NMOS transistors,
said third PMOS transistor has a drain connected to said first node, and a source connected to a drain of said first NMOS transistor,
said fourth PMOS transistor has a drain connected to said second node, and a source connected to a drain of said second NMOS transistor,
a second bias voltage is fed to gates of said third and fourth PMOS transistors,
said fifth PMOS transistor has a drain connected to a source of said third PMOS transistor, and a source connected to a power supply terminal,
said sixth PMOS transistor has a drain connected to a source of said fourth PMOS transistor, and a source connected to a power supply terminal,
a third bias voltage is fed to gates of said fifth and sixth PMOS transistors,
said second output stage includes:
seventh to tenth PMOS transistors; and
seventh to tenth NMOS transistors,
said seventh and eighth PMOS transistors have sources connected to power supply terminals and commonly-connected gates, said ninth PMOS transistor has a source connected to a drain of said seventh NMOS transistor and a drain connected to gates of said seventh and eighth PMOS transistors and to a third node,
said tenth PMOS transistor has a source connected to a drain of said eighth PMOS transistor and a drain connected to a fourth node,
said second bias voltage is fed to gates of said ninth and tenth PMOS transistors,
said seventh NMOS transistor has a drain connected to said third node, and a source connected to a drain of said first PMOS transistor,
said eighth NMOS transistor has a drain connected to said fourth node, and a source connected to a drain of said second PMOS transistor,
said first bias voltage is fed to gates of said seventh and eighth NMOS transistors,
said ninth NMOS transistor has a drain connected to a source of said seventh NMOS transistor, and a source connected to ground, said tenth NMOS transistor has a drain connected to a source of said eighth NMOS transistor, and a source connected to ground, a fourth bias voltage is fed to gates of said ninth and tenth NMOS transistors, and said output terminal is connected to said second node of said first output stage and said fourth node of said second output stage.

17. The differential amplifier circuit according to claim 14, wherein said first input stage includes first and second NMOS transistors having commonly connected sources, said second input stage includes first and second PMOS transistors having commonly connected sources, one of said differential input signals is fed to gates of said first NMOS transistor and said first PMOS transistor, the other of said differential input signals is fed to gates of said second NMOS transistor and said second PMOS transistor, said first output stage includes:
third and fourth NMOS transistors; and
third to sixth PMOS transistors, said third NMOS transistor has a source connected to ground and a drain connected to a first node, said fourth NMOS transistor has a source connected to ground and a drain connected to a second node, a first bias voltage is fed to gates of said third and fourth NMOS transistors, said third PMOS transistor has a drain connected to said first node and a source connected to a drain of said first NMOS transistor, said fourth PMOS transistor has a drain connected to said second node and a source connected to a drain of said second NMOS transistor, a second bias voltage is fed to gates of said third and fourth PMOS transistors, said fifth PMOS transistor has a drain connected to a source of said third PMOS transistor, and a source connected to a power supply terminal, said sixth PMOS transistor has a drain connected to a source of said fourth PMOS transistor and a source connected to a power supply terminal, gates of said fifth and sixth PMOS transistors are commonly connected to a drain of said third PMOS transistor, said second output stage includes:
seventh and eighth PMOS transistors; and
fifth to eighth NMOS transistors, said seventh PMOS transistor has a source connected to a power supply terminal and a drain connected to a third node, said eighth PMOS transistor has a source connected to a power supply terminal and a drain connected to a fourth node, a third bias voltage is fed to gates of said seventh and eighth PMOS transistors, said fifth NMOS transistor has a drain connected to said third node, and a source connected to a drain of said first PMOS transistor, said sixth NMOS transistor has a drain connected to said fourth node, and a source connected to a drain of said second PMOS transistor, a fourth bias voltage is fed to gates of said fifth and sixth NMOS transistors, said seventh NMOS transistor has a drain connected to a source of said fifth NMOS transistor and a source connected to ground, said eighth NMOS transistor has a drain connected to a source of said sixth NMOS transistor and a source connected to ground, gates of said seventh and eighth NMOS transistors are commonly connected to a drain of said fifth NMOS transistor, and said output terminal is connected to said second node of said first output stage and said fourth node of said second output stage.

18. The differential amplifier circuit according to claim 17, wherein said fourth bias voltage is higher than said first bias voltage, said second bias voltage is higher than said fourth bias voltage, and said third bias voltage is higher than said second bias voltage.

* * * * *